Figure 1:
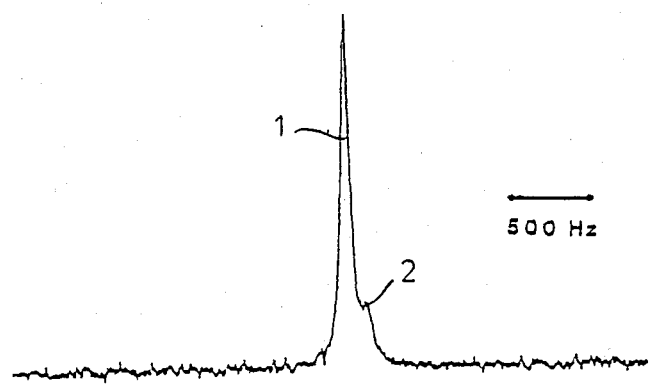

United States Patent [19]
Doddrell et al.

[11] Patent Number: 4,889,126
[45] Date of Patent: Dec. 26, 1989

[54] METHOD FOR DETERMINING THE TURNOVER OF ORGANIC MATERIAL IN LIVING TISSUE AND NMR SPECTROMETER FOR PERFORMING THIS METHOD

[76] Inventors: David M. Doddrell, 6 Luzerne, West Lake, Brisbane, Australia; Michael G. Irving, 18 Henzell Terrace, Greenslopes, Brisbane, Australia, 4120

[21] Appl. No.: 58,302

[22] Filed: Jun. 5, 1987

[30] Foreign Application Priority Data

Jun. 9, 1986 [EP] European Pat. Off. ............ 86107834

[51] Int. Cl.⁴ .............................................. A61B 5/04
[52] U.S. Cl. .................................... 128/653; 324/307
[58] Field of Search ........................ 128/653; 436/173; 324/307, 300, 309, 312, 318

[56] References Cited

U.S. PATENT DOCUMENTS

| | | | |
|---|---|---|---|
| 4,362,993 | 12/1982 | Young et al. | 324/309 |
| 4,636,730 | 1/1987 | Bottomley | 324/318 |

FOREIGN PATENT DOCUMENTS

| | | | |
|---|---|---|---|
| 0068762 | 1/1983 | European Pat. Off. | 436/173 |
| 0943569 | 7/1982 | U.S.S.R. | 436/173 |

OTHER PUBLICATIONS

Beall, P. T. et al., "NMR Data Handbook for Biomedical Applications", Pergamon Press, N.Y., ©1984, pp. XIV, 6.
Physics Abstracts, Sciences Abstracts, Series A, vol. 86, No. 1209, Jun. 1, 1983, p. 4004.
Journal of the Chemical Society, Chemical Communication, No. 11, 1983, pp. 602-605.
Chemical Abstracts, vol. 50, Oct. 1965, col. 14834g.
Proceedings of an International Symposium on NMR Imaging, Oct. 1981, pp. 175-180.
Biochemistry, vol. 23, No. 3, 1984, pp. 508-514.
Journal of the Chemical Society, Chemical Communications, No. 16, 1985, pp. 1125-1127.

*Primary Examiner*—Francis Jaworski
*Attorney, Agent, or Firm*—Pennie & Edmonds

[57] ABSTRACT

A method for determining the turnover of organic material stored in living organic tissue consists in that the deuterium content of the stored material is artificially modified from natural abundance and monitored as a function of time by measuring the CHD-signal by means of magnetic resonance spectroscopy. E.g., for determining the fat turnover in living beings, the deuterium content of the body fat may be increased by administering to the living being drinking water contaiing 10% $D_2O$ for 28 days. Thereafter, the decrease of the deuterium content of the body fat is monitored while normal water is administered. The loss of $^2H$ from body fat is an indication for the body fat turnover.

10 Claims, 3 Drawing Sheets

METHOD FOR DETERMINING THE TURNOVER OF ORGANIC MATERIAL IN LIVING TISSUE AND NMR SPECTROMETER FOR PERFORMING THIS METHOD

The invention relates to a method for determining the turnover of organic material stored in living tissue. As used in the present specification and claims, the term "turnover of organic material" refers generally to an overall rate of metabolic consumption or elimination and replenishment of organic material in living tissue.

The distribution of organic material and the building-up of stores of such material in living tissue are processes which are determined by various conditions of life and nutrition.

Thus, a good knowledge of the turnover of organic material in living tissue would be very important in various fields, for example in the fields of biological research on plants and animals, of agriculture and stock farming, of quality control of farming products, etc. In stock farming, e.g., the determination of body fat turnover would allow one to optimize the stock living condition in view of obtaining meat of best quality and best utilization of provender. As used in the present specification and claims, the term "provender" refers to any nutritious material, including solid nutritious materials, such as a dry feed, and liquid nutritious materials, such as water. Another organic material of interest stored in living tissue is for example glycogen, and there are still other storage compounds in living tissue, the determination of their turnover might become of interest as soon as a method of turnover determination is available which allows such determination in a simple, reliable and last not least non-invasive way.

Thus, it is the object of the invention, to provide such a method for determining the turnover of organic material stored in living tissue.

The invention consists in that the deuterium content of the stored material is artificially modified from natural abundance and monitored as a function of time by measuring the CHD-signal by means of magnetic resonance spectroscopy. As used in the present specification and claims, the formula "CHD" refers to a substituted methylene hydrocarbon radical in which a deuterium atom, denoted "D", replaces one of the hydrogen atoms, "H", or a parent methylene radical denoted "$CH_2$".

In order to modify the deuterium content of the stored material, the living tissue must be supplied with substances having an artificially increased or decreased deuterium content and which by metabolism or assimilation are incorporated into the stored material. The variation of the deuterium content of the stored material is an indication of its turnover.

As mentioned before, fat turnover in living beings is of special interest. If, for example, provender containing deuterium in excess of natural abundance is fed to animals, the body fat originating from such provender will have an increased content of CHD-groups which may be observed by magnetic resonance spectroscopy. Thus, the growing of fat in response to the kind and quantity of provender may be determined. Similarily, the decrease of the deuterium contents after stopping the feeding of provender having an increased deuterium content shows how the stored fat is reduced and replaced by newly generated fat. Thus, a preferred embodiment of the invention consists in that the deuterium content of the body fat is increased to a predetermined level and then monitored during its decrease to natural abundance without any further provision of deuterium in excess of natural abundance. However, if the supply of substances having an artificially increased deuterium content bears some risk for the supplied tissue, substance having an artificially decreased deuterium content may be used. In this case, the decrease of deuterium in the stored material during the feeding phase and/or the increase after the termination of the feeding phase may be determined.

A simple method for artificially modifying the deuterium content of the stored material consists in supplying the living tissue with water containing heavy water ($D_2O$) in a proportion which is different from natural abundance. As used in the present specification and claims, the symbol "$D_2O$" refers to a water molecule in which both hydrogen atoms have been replaced by deuterium atoms and the symbol "HOD" refers to a water molecule in which one of the two hydrogen atoms has been replaced by a deuterium atom. In order to increase the deuterium content of the living tissue, it may be supplied with water containing up to 10% heavy water.

The new method may be performed with nearly any modern NMR spectrometer which includes an RF pulse transmitter for generating HF pulse sequences allowing the excitation of deuterium spins in the tissue under investigation, and receiving means for receiving and analyzing the spin resonance signals. If the measurement is to be limited to a specific volume, the spectrometer may comprise gradient field generating and switching means for performing volume selective pulse experiments (see for example J. Magn. Reson. 56, 350 (1984) and 59, 338 (1984)). A very simple means for volume selection, however, is the use of spectrometer having a surface coil which is tuned to the spin frequency of deuterium included in the tissue which is exposed to the homogeneous static magnetic field produced by the magnet of the NMR spectroeter.

The various features and advantages of the present invention may be more readily understood with reference to the following detailed description taken in conjunction with the accompanying drawings, in which:

FIG. 1 shows the natural abundance 30.7 MHz $^2H$ NMR spectrum of the abdomen of a mouse.

Figure 2:
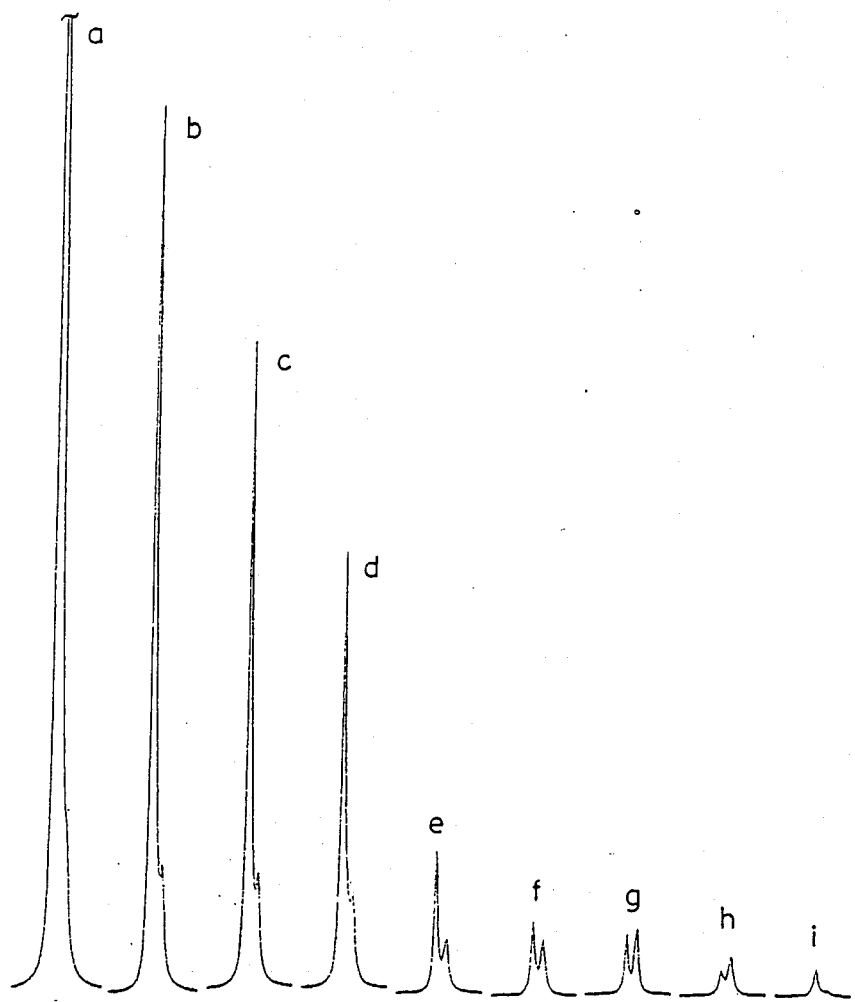
Figure 3A:
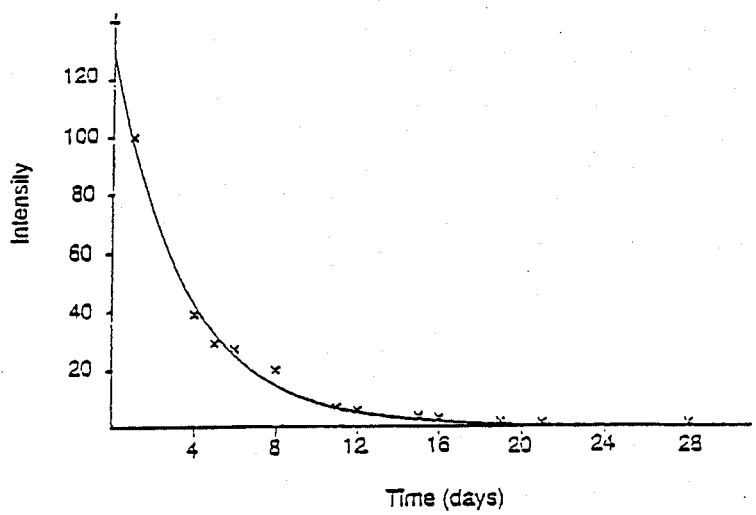
Figure 3B:
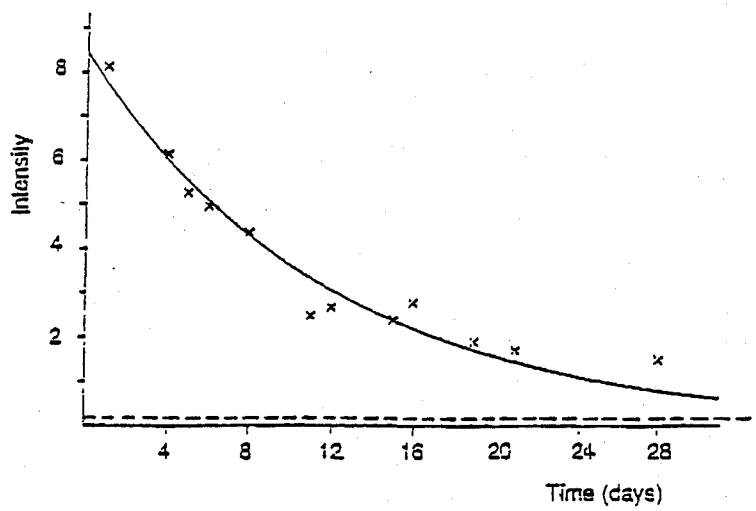

FIG. 2 shows the $^2H$ NMR spectra of a mouse provided with drinking water containing 10% heavy water for 28 days followed by the removal of $D_2O$ from drinking water, and FIGS. 3a and 3b, respectively, show plots of $^2H$ signal intensity against time for the (a) HOD- and (b) -CHD-peaks.

Experiments were performed on an extensively modified Bruker NMR spectrometer using an ASPECT-2000 computer and a CXP modulator and pulse programmer. The spectrometer included a superconducting OXFORD magnet having a bore of 130 mm with a free bore of 110 mm diameter and being operated at 4.7 T. A probe using a horizontal solenoid coil of 1.5 cm width was tuned to the $^2H$ excitation frequency. Female Quackenbush mice (30–40 g body weight) were anaesthetised (Ketamine, 100 mg/kg and Diazepam 3 mg/kg body weight, intraperitoneally) and positioned within the coil around the upper abdomen, approximately at the level of the liver. The temperature of the probe was maintained at 30±2° C. and air at a flow rate of 10 ml/s was supplied to animals in the probe to prevent hypoxia.

Because of heating from the shims, this probe temperature and airflow maintained the body temperature of mice at 35° C. Each spectrum was obtained by first accumulating 1000 free-induction-decay signals and then Fourier transforming the accumulated free-induction-decay signals. Each free-induction-decay signal was obtained following an essentially 90° pulse having a pulse width of about 50 μs. The time interval between successive 90° pulses was about 0.5 s. For studies of fat turnover, mice were administered $D_2O$ in the drinking water in a concentration of about 10 parts by weight $D_2O$ to about 90 parts by weight $H_2O$ for 28 days before being administered normal water and the loss of $^2H$ from body fat and body water stores was determined.

FIG. 1 shows the in vivo whole body $^2H$ spectrum of mice recorded at 30.7 MHz. Spectra with a high signal/noise ratio were obtained with acquisition times as short as 0.3 s. In addition to a first peak 1 arising from HOD, the spectrum includes a second peak 2 located at a position in the spectrum corresponding to a higher field. The second peak 2 corresponds to the -CHD- groups of body fat. This spectrum was obtained in 8 min.

In mice in which the level of $^2H$ had been artificially increased, a good signal was obtained in one scan, particularly from animals administered with $D_2O$ in drinking water which produced a free induction decay intense enough to use for field shimming. This level of $^2H$ incorporation was achieved after only 12 hours exposure to drinking water containing 10% $D_2O$. The $^2H$ level in these animals equilibrated at a constant value after 3 to 4 days. Mice were exposed to 10% $D_2O$ in their drinking water for 28 days before giving normal water, after which time the loss of deuterium from the body was monitored for a further 28 days. As depicted in FIG. 2, the CHD-signal is initially unresolved but appears once the intensity of the HOD-peak is reduced. Clearly there has been incorporation of deuterium into the fat tissue, the level after 28 days exposure having increased by 35 times the natural abundance level. The spectra shown in FIG. 2 were recorded (a) 1, (b) 4, (c) 5, (d) 8, (e) 11, (f) 15, (g) 16, and (h) 28 days after resumption of normal drinking water. Spectrum (i) was recorded at natural abundance prior to administration of $D_2O$ of drinking water.

A plot of the signal intensity against time is shown in FIGS. 3a and 3b for the HOD- and -CHD-peaks, respectively. The loss of deuterium from fat tissue is significantly slower than from body water, with half life of 8 to 9 days compared to 3 to 4 days, respectively. This is demonstrated clearly in FIG. 3b where the HOD-signal actually becomes smaller than the CHD-signal after 16 days. This observation represents a simple method for determining the rate of fat turnover in vivo. Determination of $^2H$-$T_1$ relaxation times in mice 20 days after removal of $D_2O$ from drinking water gave values of 34±4 ms for the -CHD-groups in body fats compared to 228±3 ms for the HOD-groups in body water. This further demonstrates the versatility of this technique in distinguishing fat metabolism in vivo.

Similar results may be obtained when stores of other organic materials in living tissue of plants or animals are investigated. A main advantage of the invention consists in that the method is non-invasive and thus may even be used with men. In this case, a decrease of the natural deuterium content would be recommendable. Further, the possibility to restrict the measurement of the CHD-signal to small volumes of interest by means of special pulse experiments or surface coils, allows the investigation of narrow body regions and thus, for example, the observation of the behaviour of different organs of the same body.

We claim:

1. Method for determining the rate of metabolism of an organic material in living tissue, comprising the steps of:
    (a) providing a nutritious material which is appropriate to form by metabolism a component of said organic material;
    (b) modifying a deuterium content of said nutritious material from a natural abundance deuterium content;
    (c) feeding said modified nutritious material to said living tissue;
    (d) measuring a deuterium content of said organic material by means of NMR-spectroscopy; and
    (e) evaluating a rate of metabolism of said organic material by establishing a relationship between a rate of variation of the deuterium content of said organic material as measured by means of NMR-spectroscopy and the amount in which the deuterium fed to the tissue differs from natural abundance.

2. The method as claimed in claim 1 wherein said modified nutritious material is water containing heavy water in a proportion which is different from natural abundance.

3. The method to claim 2 in which water containing up to 10 percent of heavy water is fed to said tissue.

4. The method as claimed in claim 1 wherein the deuterium content of said organic material is made different from natural abundance by feeding a predetermined amount of said modified nutritious material for a predetermined time interval and thereafter the rate of return of said deuterium content to its natural abundance is monitored.

5. The method of claim 1 in which the measurement of the deuterium content is limited to selected regions of said living tissue.

6. A method for determining the rate of metabolism of an organic material in living tissue of an organism, comprising the steps of:
    (a) feeding the organism a first nutritious material for a first period of time, the first nutritious material being appropriate to form by metabolism in the organism a component of said organic material, the first nutritious material including deuterium at a first deuterium concentration;
    (b) feeding the organism a second nutritious material for a second period of time subsequent to the first period of time, the second nutritious material being appropriate to form by metabolism in the organism said component of said organic material, the second nutritious material including deuterium at a second deuterium concentration, the second deuterium concentration differing from the first deuterium concentration;
    (c) measuring an intensity of at least one deuterium-nuclear-magnetic-resonance signal component from the living tissue of the organism at a plurality of measured times during the second period of time by means of nuclear magnetic resonance spectroscopy; and
    (d) analyzing the intensities of the deuterium nuclear-magnetic-resonance signal component measured during the second period of time to determine a rate of metabolism of the organic material in the tissue.

7. The method of claim 6 in which the first nutritious material is water having a first deuterium concentration and the second nutritious material is water having a second deuterium concentration different from the first deuterium concentration.

8. The method of claim 7 in which the second deuterium concentration is a natural-abundance deuterium concentration.

9. The method of claim 8 in which the first deuterium concentration is greater than the natural-abundance deuterium concentration.

10. The method of claim 9 in which the first nutritious material is water prepared by adding up to about ten percent by weight heavy water to natural-abundance water and the second nutritious material is natural-abundance water.

* * * * *

UNITED STATES PATENT AND TRADEMARK OFFICE
CERTIFICATE OF CORRECTION

PATENT NO. : 4,889,126
DATED : December 26, 1989
INVENTOR(S) : David M. Doddrell, et al.

It is certified that error appears in the above-identified patent and that said Letters Patent are hereby corrected as shown below:

Title page:

The Assignee is Bruker Analytische Messtechnik GmbH, Federal Republic of Germany.

Signed and Sealed this

Twenty-eighth Day of May, 1991

Attest:

HARRY F. MANBECK, JR.

Attesting Officer

Commissioner of Patents and Trademarks